United States Patent
Aoki et al.

(10) Patent No.: US 6,501,169 B1
(45) Date of Patent: Dec. 31, 2002

(54) SEMICONDUCTOR DEVICE WHICH PREVENTS LEAKAGE OF NOISE GENERATED IN A CIRCUIT ELEMENT FORMING AREA AND WHICH SHIELDS AGAINST EXTERNAL ELECTROMAGNETIC NOISE

(75) Inventors: Yutaka Aoki, Ome (JP); Hiroshi Takenaka, Iruma (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/708,379

(22) Filed: Nov. 8, 2000

(30) Foreign Application Priority Data

Nov. 29, 1999 (JP) ............................................ 11-337342

(51) Int. Cl.[7] ...................... H01L 23/12; H01L 23/053; H01L 23/48; H01L 23/52; H01L 29/40; H01L 21/4763
(52) U.S. Cl. ....................... 257/700; 257/774; 438/618; 438/622
(58) Field of Search ................................. 257/700, 774; 438/618, 622

(56) References Cited

U.S. PATENT DOCUMENTS 5,386,088 A  * 1/1995  Gardner ...................... 174/261
6,294,436 B1 * 9/2001  Park et al. ................... 438/396

FOREIGN PATENT DOCUMENTS

| JP | 1-173733 | 7/1989 |
| JP | 5-218042 | 8/1993 |

* cited by examiner

Primary Examiner—Tuan H. Nguyen
Assistant Examiner—Nema Berezny
(74) Attorney, Agent, or Firm—Frishauf, Holtz, Goodman & Chick, P.C.

(57) ABSTRACT

A semiconductor device of a CSP structure is obtained by forming projection electrodes on a plurality of circuit element forming areas of a semiconductor wafer substrate, and then dividing the wafer into chips. Wiring patterns connected to connection pads for signal transmission are provided on the upper surface of an insulating film formed on the circuit element forming areas, and a conductive layer connected to a connection pad connected to a ground potential is provided on the resultant structure except for on the wiring patterns and on areas near the wiring patterns. Further, a thin film circuit element may be provided at the same layer as the conductive layer or below the conductive layer.

10 Claims, 11 Drawing Sheets

SEMICONDUCTOR DEVICE WHICH PREVENTS LEAKAGE OF NOISE GENERATED IN A CIRCUIT ELEMENT FORMING AREA AND WHICH SHIELDS AGAINST EXTERNAL ELECTROMAGNETIC NOISE

CROSS-REFERENCE TO RELATED APPLICATIONS

This application is based upon and claims the benefit of priority from the prior Japanese Patent Application No. 11-337342, filed Nov. 29, 1999, the entire contents of which are incorporated herein by reference.

BACKGROUND OF THE INVENTION

This invention relates to a semiconductor device of a CSP (Chip Size Package) structure, and a process for manufacturing the device.

To accelerate downsizing and thinning of electronic devices, a semiconductor device of a CSP (Chip Size Package) structure, in which the chip and the package have substantially the same size, has recently been used.

Figure 11A:
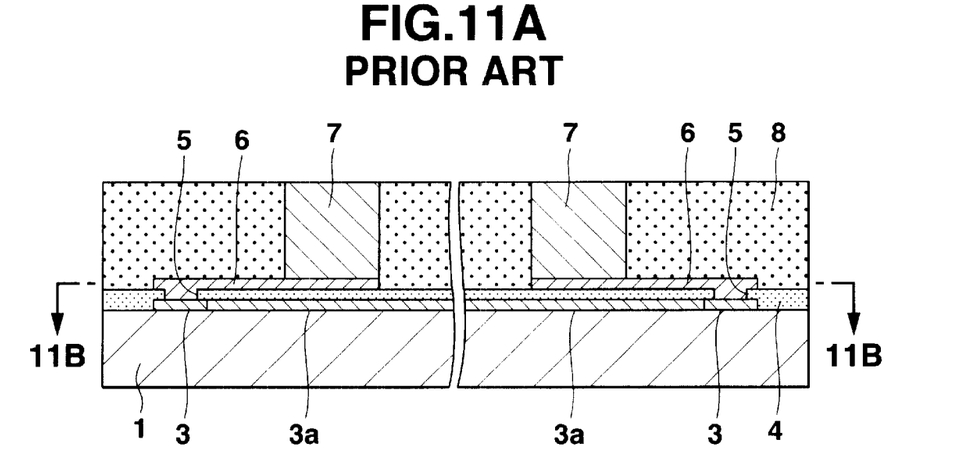
FIG. 11A is a sectional view illustrating the structure of a conventional semiconductor device.
Figure 11B:
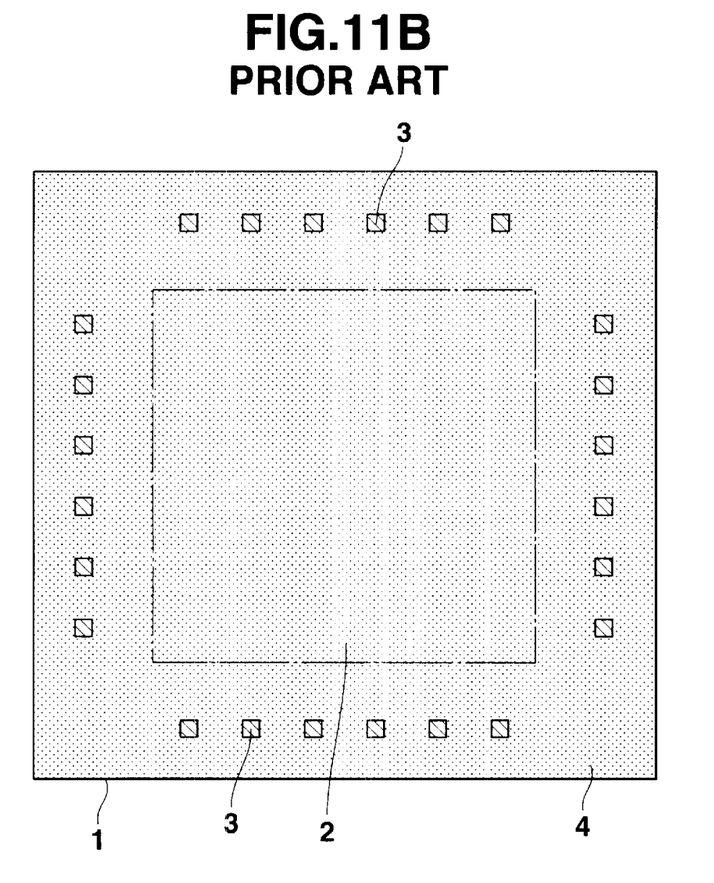
FIG. 11B is a sectional view taken along line 11B—11B of FIG. 11A.

FIG. 11A is a sectional view illustrating an essential part of an example of such a conventional semiconductor device. FIG. 11B is a sectional view taken along line 11B—11B of FIG. 11A, illustrating a structure not including a wiring pattern 6, and a sealing film 8 and projection electrodes 7 formed on the wiring pattern 6.

This semiconductor device comprises a semiconductor substrate 1 formed of, for example, a silicon substrate. The semiconductor substrate 1 is flat and square-shaped, and has a central circuit element forming area 2 indicated by the one-dotted chain line, as is shown in FIG. 11B. If the semiconductor device is an LSI for driving a liquid crystal display panel, multiple circuit elements such as an oscillation circuit, a regulator circuit, a liquid crystal driver circuit, etc., which are not shown, are provided in the circuit element forming area 2.

A plurality of connection pads 3 are provided on the upper surface of the semiconductor substrate 1 outside the circuit element forming area 2. The connection pads 3 are formed of end portions of wirings 3a provided on the upper surface of the semiconductor substrate 1, and are hence connected to the circuits, such as the liquid crystal driver circuit, in the circuit element area 2. An insulating film 4 made of, for example, silicon oxide is provided on the upper surface of the semiconductor substrate 1 except for on central portions of the connection pads 3. In other words, openings 5 are formed in the insulating film 4, thereby exposing the central portions of the connection pads 3 therethrough. The wiring patterns 6 are provided on the exposed upper surfaces of the connection pads 3 and on the upper surface of the insulating film 4 located inside the connection pads 3. The wiring patterns 6 are provided to connect the connection pads 3 to the projection electrodes 7, and to appropriately locate the projection electrodes 7 on the circuit element forming area 2. The projection electrodes 7 are formed of, for example, columnar electrodes and provided on the upper surfaces of pad portions as end portions of the wiring pattern 6. The sealing film 8 made of, for example, epoxy resin is provided on the entire upper surface of the semiconductor substrate 1 except for on the projection electrodes 7. When mounting the above-described semiconductor device onto another circuit board, a mounting technique called "facedown bonding", not shown, is used. For example, solder balls (not shown) are formed on the respective projection electrodes 7, thereby electrically connecting the electrodes to, for example, another circuit board.

In the conventional semiconductor device, the wiring pattern 6 is simply provided on the upper surface of the insulating film 4. Therefore, the device is not protected from electromagnetic noise generated in the circuit element forming area 2 or entering it from the outside. Since, as described above, the semiconductor device is mounted by facedown bonding, it is possible that electromagnetic noise generated in the circuit element forming area 2 will easily leak to the outside of the device, thereby adversely affecting the operation of an external circuit, or that electromagnetic noise from the outside will easily enter, for example, a liquid crystal driver circuit provided in the circuit element forming area 2, thereby causing the device to operate erroneously.

BRIEF SUMMARY OF THE INVENTION

It is the object of the invention to provide a semiconductor device of a CSP structure obtained by forming projection electrodes for connecting the semiconductor device to another circuit board on a plurality of circuit element forming areas of a semiconductor wafer, and then dividing the wafer into chips, the semiconductor device preventing noise generated in the circuit element forming area from easily leaking to the outside, and being sufficiently protected from the influence of external electromagnetic noise.

To attain the object, there is provided a semiconductor device according to one aspect of the invention, which incorporates a circuit element forming area as a central area, and a plurality of connection pads for signal transmission and a connection pad connected to the ground potential of the circuit element provided around the circuit element forming area, wiring pattern connected to the connection pads being provided on the upper surface of an insulating film formed on the circuit element forming area, a conductive layer connected to the connection pad connected to the ground potential being provided on the insulating film except for on the wiring pattern and on areas near the wiring pattern, and projection electrodes being provided on the wiring pattern and the conductive layer. Since, in this structure, a greater part of the circuit element forming area except for the wiring pattern and the areas near it is covered with the conductive layer, leakage of electromagnetic noise generated in the circuit element forming area can be suppressed, and the influence of external electromagnetic noise can be reduced. Moreover, the spread of an electric field near the wiring pattern for signal transmission can be suppressed, thereby increasing the signal transmission speed, and reducing cross talk between adjacent sections of the wiring pattern for signal transmission.

To attain the object, there is provided a semiconductor device according to another aspect of the invention, which incorporates, as in the above structure, a conductive layer provided on the insulating film in the circuit element forming area except for on the wiring pattern and on areas near the wiring pattern, and a thin film circuit element, such as a induction element or a capacitor element, provided at the same layer or below the conductive layer. Also in this structure, a greater part of the circuit element forming area is covered with the conductive layer. Accordingly, this structure provides, in addition to the aforementioned advantage, the advantage that the function of the semiconductor device can be enhanced with its size almost unchanged, or can be made compact with its function unchanged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Semiconductor devices and their methods according to the embodiments of the invention will be described in detail with reference to the accompanying drawings.

First Embodiment

Figure 1A:
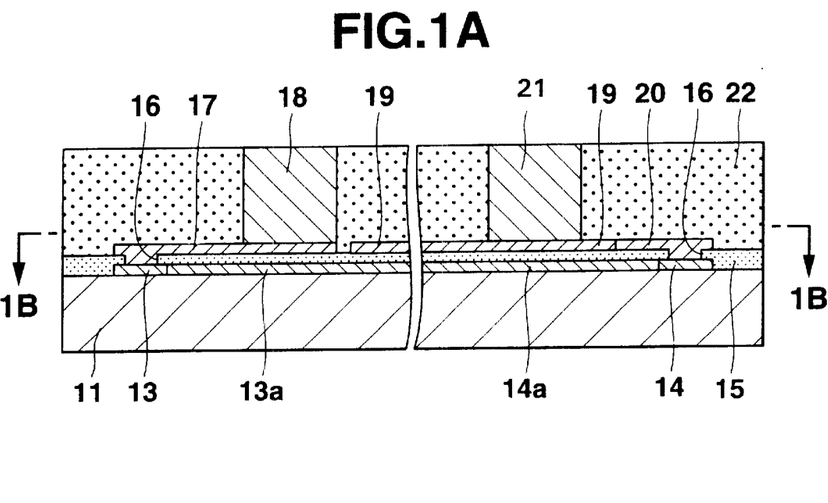
FIG. 1A is a sectional view illustrating the structure of a semiconductor device according to a first embodiment of the invention.
Figure 1B:
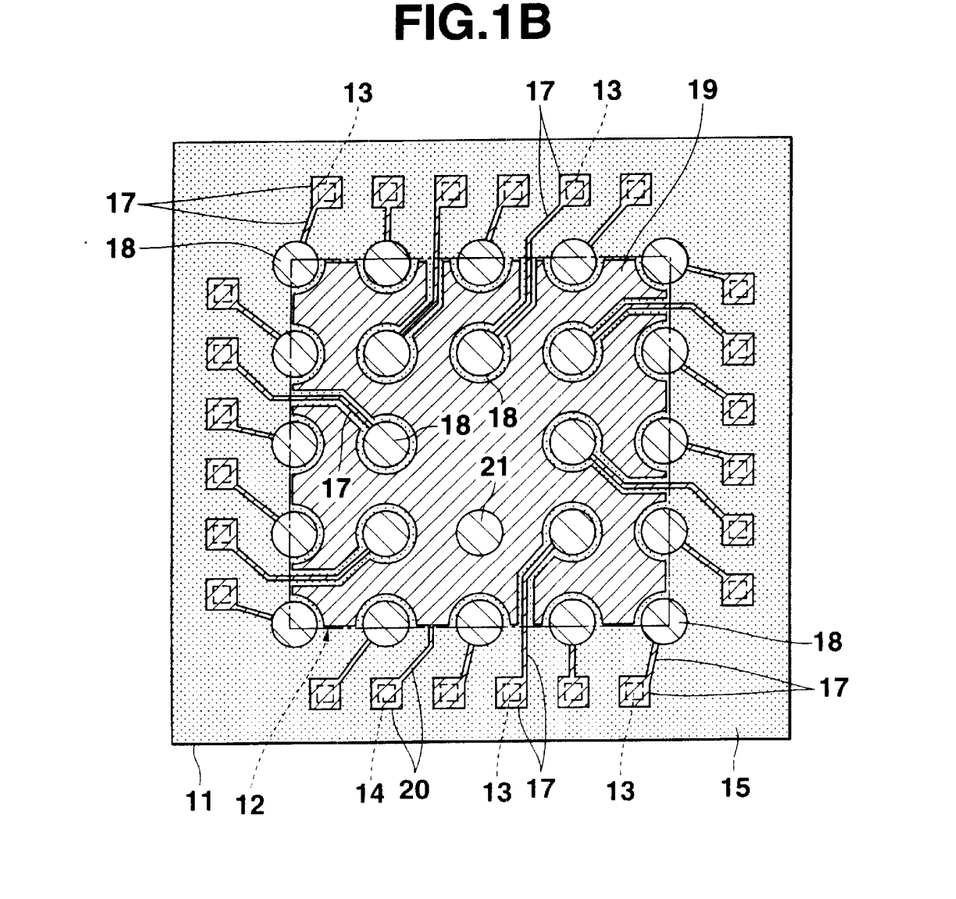
FIG. 1B is a sectional view taken along line 1B—1B of FIG. 1A.

FIG. 1A is a sectional view illustrating part of a semiconductor device according to a first embodiment of the invention, and FIG. 1B is a sectional view taken along line 1B—1B of FIG. 1A, showing the semiconductor device of FIG. 1A but not showing a sealing film 22 incorporated therein.

This semiconductor device has a semiconductor substrate (e.g. silicon substrate) 11. The semiconductor substrate 11 is flat and square-shaped, and a central portion is set as a circuit element forming area 12 indicated by the one-dotted chain line in FIG. 1B, as in the case of FIG. 11B.

In each of the embodiments described hereinafter, the semiconductor substrate 11 is formed by dividing a semiconductor wafer substrate 11a (FIG. 2A) each including a plurality of chip forming areas into chips, as clarified in its manufacturing process described later.

If the semiconductor device is an LSI for driving a liquid crystal display panel, multiple circuit elements such as an oscillation circuit, a regulator circuit, a liquid crystal driver circuit, etc., which are not shown, are provided in the circuit element forming area 12, as in the conventional case.

A plurality of connection pads 13 for signal transmission and a single connection pad 14 connected to a ground potential of the circuit element are provided on the upper surface of the semiconductor substrate 11 outside the circuit element forming area 12. The connection pads 13 and 14 are formed of respective end portions of wiring 13a and 14a provided on the upper surface of the semiconductor substrate 11, and are hence connected to the circuits, such as the liquid crystal driver circuit, in the circuit element area 12. A first insulating film 15 made of, for example, silicon oxide is provided on the upper surface of the semiconductor substrate 11 except for on central portions of the connection pads 13 and 14. In other words, openings 16 are formed in the first insulating film 15, thereby exposing the central portions of the connection pads 13 and 14 therethrough.

Wiring patterns 17 for signal transmission are provided on the exposed upper surfaces of the connection pads 13 and 14 and on the upper surface of the first insulating film 15 located inside the connection pads 13 and 14. Columnar projection electrodes 18 are provided on the upper surfaces of pad portions, as end portions, of the wiring patterns 17.

In this embodiment and the embodiments described later, the wiring patterns 17 are provided to appropriately locate projection electrodes 18 for connection on the circuit element forming area 12, as in the conventional case. However, the projection electrodes 18 may be provided directly on the connection pads 13. In this case, the wiring patterns 17 are provided only on the connection pads 13.

A conductive layer 19 is provided on the first insulating film 15 in the circuit element forming area 12 except for on the wiring patterns 17 and on areas near the wiring patterns 17. The conductive layer 19 is connected to the connection pad 14 connected to the ground potential via a wiring pattern 20. A projection electrode 21 is provided on a predetermined upper portion of the conductive layer 19. A sealing film 22 made of, for example, epoxy resin is provided on the entire upper surface of the semiconductor substrate 11 except for on the projection electrodes 18 and 21. The conductive layer 19 and the wiring pattern 20 are made of the same material and formed simultaneously with the wiring patterns 17.

Since, in this semiconductor device, the conductive layer 19 connected to the ground potential of the circuit element via the wiring pattern 20 and the connection pad 14 is provided on the first insulating film 15 in the circuit element forming area 12 except for on the signal transmission wiring patterns 17 and on areas near the wiring patterns 17, a greater part of the circuit element forming area 12 is covered with the conductive layer 19. As a result, electromagnetic noise generated in the circuit element forming area 12 is substantially prevented from leaking to the outside, and also the influence of electromagnetic noise from the outside is minimized.

Further, since, in the circuit element forming area 12, the conductive layer 19 connected to the ground potential is provided around the signal transmission wiring patterns 17, expansion of an electric field near the wiring pattern 17 is suppressed. Accordingly, the signal transmission speed can be increased, and also cross talk between adjacent portions of the wiring pattern 17 for signal transmission can be reduced.

FIGS. 2A–2E are sectional views useful in explaining a process for manufacturing the semiconductor device of the first embodiment.

Figure 2A:
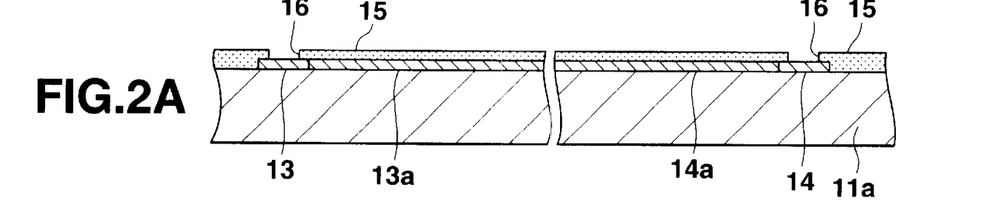
FIGS. 2A–2E are sectional views useful in explaining a process for manufacturing the semiconductor device of the first embodiment.

At first, as shown in FIG. 2A, the first insulating film 15 made of silicon oxide, silicon nitride, etc. is formed on the upper surfaces of the connection pads 13 for signal transmission and the connection pad 14 connected to the ground potential of the circuit element, which are formed of, for example, aluminum electrodes provided on the circuit surface of a semiconductor wafer substrate 11a including a plurality of chip forming areas. After that, the openings 16 are formed in the first insulating film 15 to expose central portions of the connection pads. A protection film (not shown) made of, for example, a polyimide-based resin may be formed on the upper surface of the first insulating film 15. In this case, the polyimide-based resin may be coated by spin coating, printing using a squeeze or coating using a dispenser. Furthermore, the protection film material is not limited to the polyimide-based resin, but may be epoxy resin, PBO (benzaoxydol-based) resin, etc. The protection film is formed by coating and hardening such a resin, executing resist patterning and protection film patterning using an etching liquid, and separating a resist.

Figure 2B:
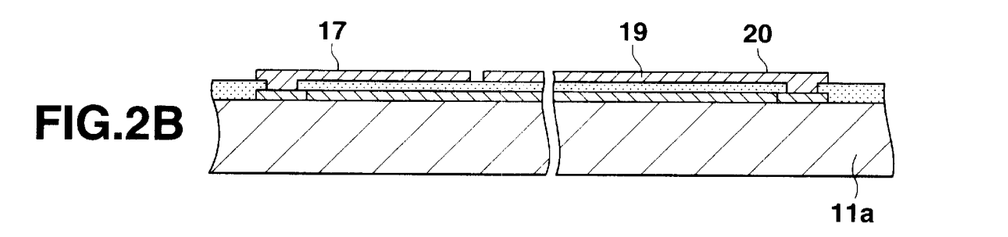

After that, as shown in FIG. 2B, a metal layer is formed on the first insulating film 15 and the connection pads 13 and 14 exposed through the openings 16, and is patterned to a predetermined shape to thereby form the wiring patterns 17 connected to the connection pads 13 for signal transmission, and the conductive layer 19 connected to the connection pad 14. The metal layer is formed by depositing an UBM layer (not shown) on the entire surface of the first insulating film 15 by, for example, UBM sputtering, then coating and hardening a photoresist for the metal layer, patterning it to have openings of predetermined shapes by photolithography, and executing electrolytic plating on the openings formed using the resist. Electroless plating may be used instead of the electrolytic plating to form the metal layer. Moreover, the conductive layer may be made of copper, aluminum, gold or any alloy of these metals, which has excellent conductive properties.

Figure 2C:
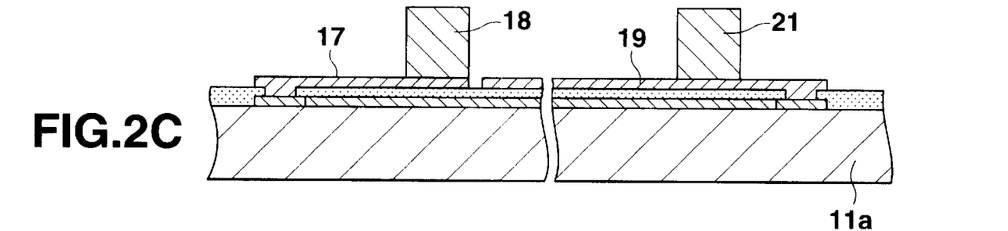

Subsequently, as shown in FIG. 2C, the projection electrodes 18 are formed on predetermined portions of the wiring patterns 17, and the projection electrode 21 is formed on a predetermined portion of the conductive layer 19. The projection electrodes 18 and 21 are formed on the wiring patterns 17 and the conductive layer 19, respectively, by, for example, coating and hardening projection electrodes forming photoresist to a thickness of about 100–150 µm, then forming openings in the resist for exposing predetermined portions, and executing electrolytic plating on the openings.

The projection electrodes 18 and 21 may be formed by electroless plating or stud bumping. These electrodes may be made of copper, solder, gold, nickel, etc., which has excellent conductive properties. When forming the projection electrodes using solder, the printing method can be used. Further, when forming the projection electrodes using solder, spherical ones can be formed by executing a reflow treatment in a later stage.

Figure 2D:
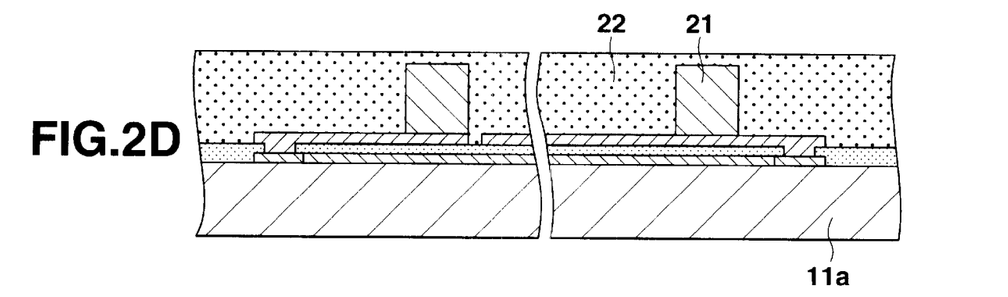

Thereafter, as shown in FIG. 2D, the entire surface of the resultant structure is coated with a resin such as polyimide resin, epoxy resin, etc. so as to cover the projection electrodes 18 and 21, and is hardened, thereby forming the sealing film 22. The sealing film 22 can be formed by printing, dip coating, spin coating, or die coating.

Figure 2E:
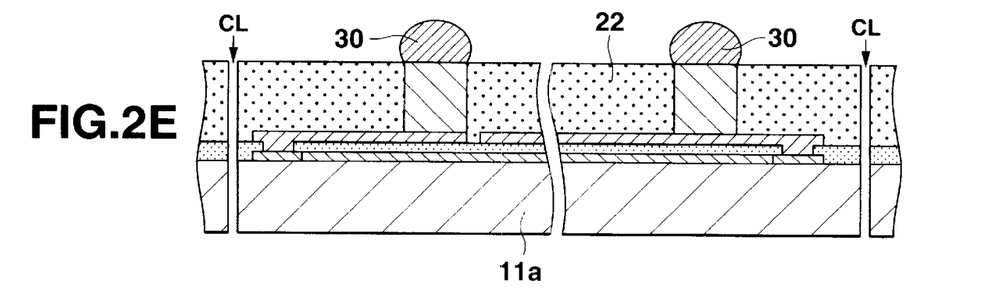

Lastly, as shown in FIG. 2E, the upper surface portion of the sealing film 22 is ground to thereby expose the end surfaces of the projection electrodes 18 and 21 and remove oxide films which are naturally formed on the top surface thereof. Where the oxide films are removed, a metalizing treatment such as solder printing is executed or solder balls 30 are formed. After that, the wafer 11a is diced along a predetermined cutting line CL around the chip forming area into chips. Thus, a semiconductor device of a structure as shown in FIG. 1A is created.

Second Embodiment

Figure 3:
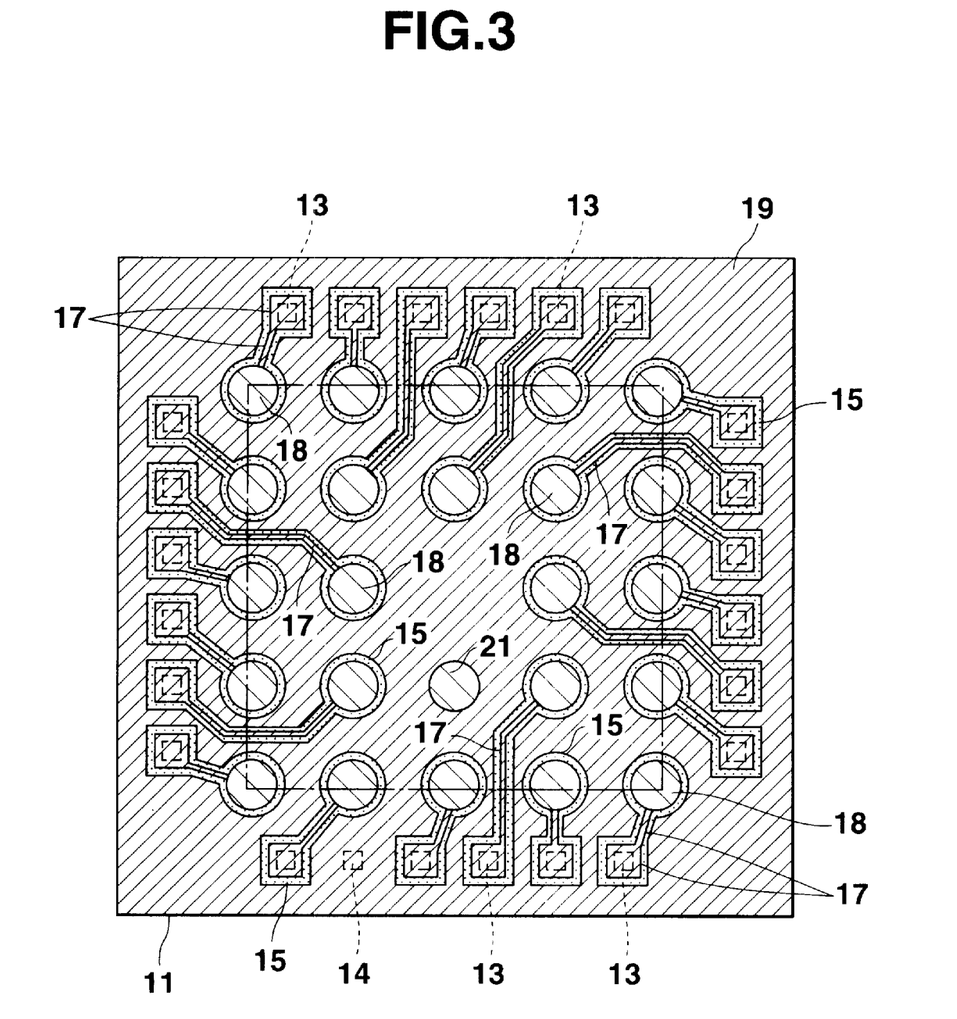
FIG. 3 is a sectional view illustrating the structure of a semiconductor device according to a second embodiment of the invention.

FIG. 3 is a sectional view illustrating an essential part of a semiconductor device according to a second embodiment of the invention, but not showing a sealing film 22 incorporated therein. In this figure, elements similar to those employed in the first embodiment are denoted by corresponding reference numerals, and no detailed description will be given thereof.

In the first embodiment, the conductive layer 19 is provided on the upper surface of the first insulating film 15 in the circuit element forming area 12, except for on the wiring patterns 17 and areas near the wiring patterns 17. On the other hand, in the second embodiment, the conductive layer 19 extends up to the edges of the semiconductor substrate 11.

Since, in the second embodiment, substantially the entire circuit element forming area 12 is covered with the conductive layer 19, the conductive layer's effect of preventing electromagnetic noise generated in the area 12 from leaking to the outside, and preventing electromagnetic noise from the outside from adversely affecting the area 12 is more enhanced than in the first embodiment. Further, since the conductive layer 19 covers the signal transmission wiring patterns 17 and their vicinities, spread of the electric field around the wiring patterns 17 can be further suppressed, thereby further increasing the signal transmission speed. Moreover, cross talk between adjacent portions of the wiring patterns 17 can be further reduced.

In addition, in the second embodiment, the connection pad 14 connected to the ground potential is covered with the conductive layer 19, which does knot require wiring pattern as denoted by reference numeral 20 in FIG. 1.

Third Embodiment

Figure 4A:
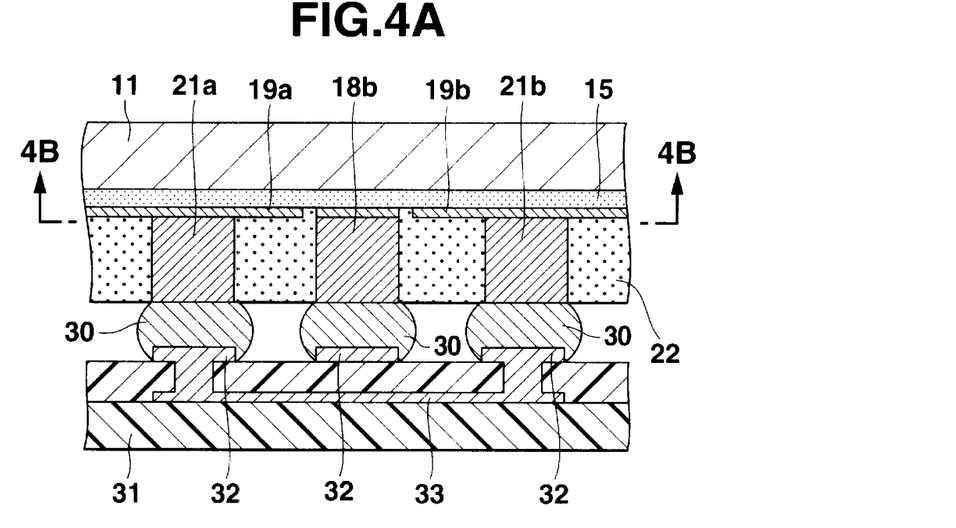
FIG. 4A is a sectional view illustrating the structure of a semiconductor device according to a third embodiment of the invention.
Figure 4B:
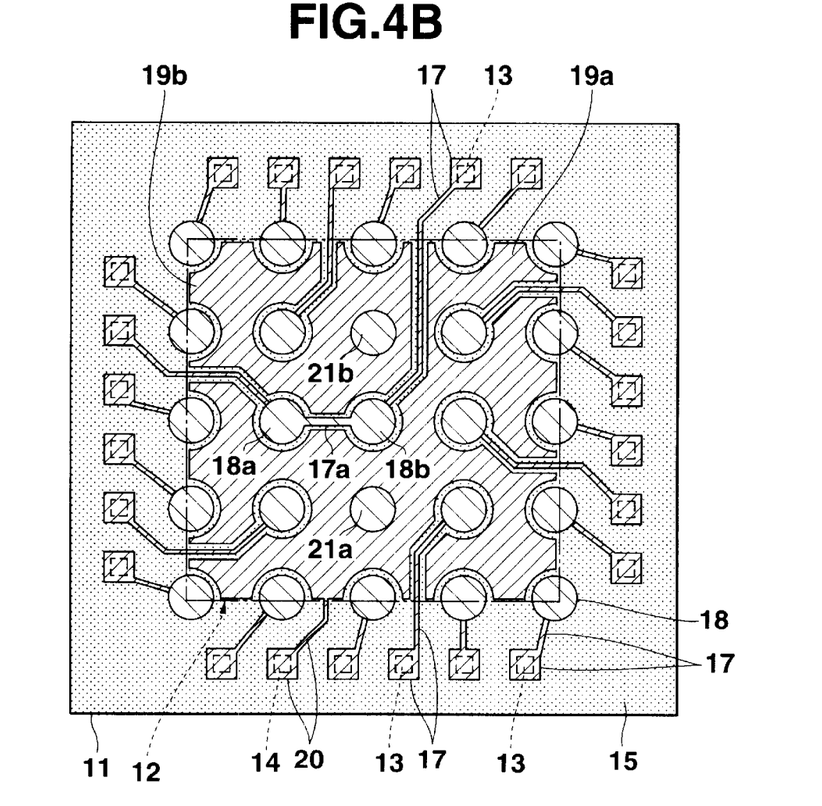
FIG. 4B is a sectional view taken along line 4B—4B of FIG. 4A.

FIG. 4A is a sectional view illustrating an essential part of a semiconductor device according to a third embodiment of the invention. FIG. 4B is a sectional view taken along line 4B—4B of FIG. 4A, illustrating the semiconductor device but not illustrating a sealing film 22 incorporated therein is excluded. In these figures, elements similar those employed in the first embodiment are denoted by corresponding reference numerals, and no detailed description will be given thereof.

The third embodiment is directed to a case where certain two projection electrodes 18a and 18b, which are connected to corresponding ones of the connection pads 13 by the wiring patterns 17, are electrically connected to each other by a section 17a of the wiring pattern 17.

In this case, the conductive layer is divided into two portions as indicated by reference numerals 19a and 19b. One conductive layer section (indicated by 19a in the case of FIG. 4B) is connected to the connection pad 14 connected to the ground potential of the circuit element, whereas the other conductive layer section 19b is not connected to the connection pad 14. Further, the two conductive layer sections 19a and 19b cannot be directly connected to each other on the circuit element forming area 12.

In light of this, the third embodiment employs projection electrodes 21a and 21b, located on respective predetermined portions of the two conductive layer sections 19a and 19b. The thus-constructed semiconductor device is mounted on a circuit board 31 as shown in FIG. 4A. The projection electrodes 21a, 21b and 18b are connected to respective connection terminals 32 of the circuit board 31 by respective solder balls 30 provided on the projection electrodes 21a, 21b and 18b.

The circuit board 31 is formed of a multi-layer board. Predetermined two of the connection terminals 32 provided on the board 31 are connected to each other by internal wiring 33, and also to the projection electrodes 21a and 21b by the solder balls 30. Accordingly, the conductive layer sections 19a and 19b are electrically connected to each other, irrespective of the projection electrode 18b, by means of the projection electrode 21a, one of the solder balls 30, one of the connection terminals 32, the internal wiring 33, another connection terminal 32, another solder ball 30, and the projection electrode 21b. As a result, even where the conductive layer is divided into two portions or more, the divided portions can be electrically connected to each other and hence can function as conductive layers connected to the ground potential of the circuit element.

Fourth Embodiment

Figure 5A:
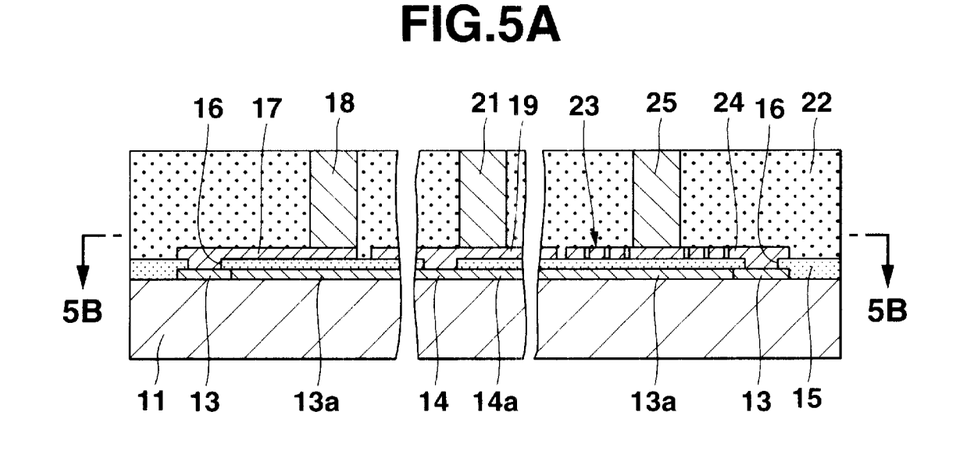
FIG. 5A is a sectional view illustrating the structure of a semiconductor device according to a fourth embodiment of the invention.
Figure 5B:
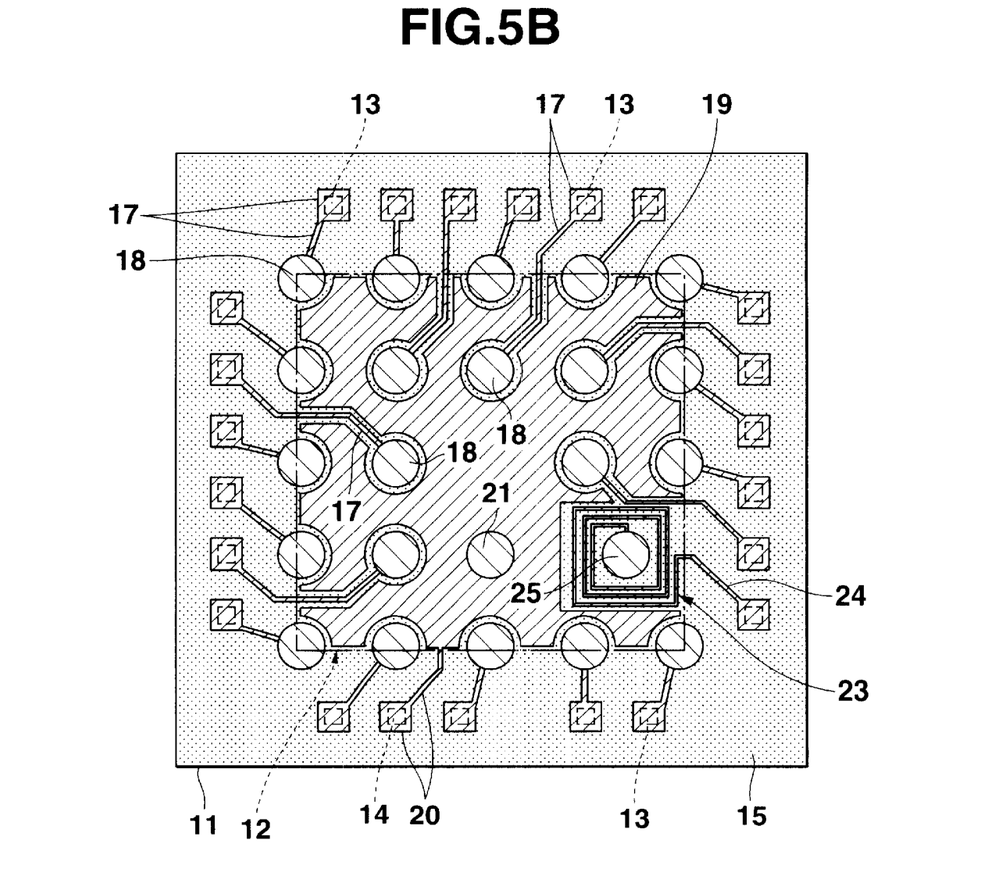
FIG. 5B is a sectional view taken along line 5B—5B of FIG. 5A.

FIG. 5A is a sectional view illustrating an essential part of a semiconductor device according to a fourth embodiment of the invention, and FIG. 5B is a sectional view taken along line 5B—5B of FIG. 5A, showing the semiconductor device of FIG. 5A but not showing a sealing film 22 incorporated therein. In these figures, elements similar to those employed in the first embodiment are denoted by corresponding reference numerals, and no detailed description will be given thereof.

The fourth embodiment differs from the first embodiment in that, in the former, wiring patterns 17 and a conductive layer 19, which are formed of a metal layer, are provided on a first insulating film 15, and a induction element 23 is formed of an electrically conductive pattern 24 that is patterned such that an inductance component is created. It is a matter of course that the conductive layer 19 may be extended to the edges of the semiconductor substrate 11 as in the second embodiment. Moreover, to create the inductance component, the conductive pattern 24 constituting the induction element 23 has a square-shaped spiral pattern, a rectangular-shaped spiral pattern, or a loop-shaped pattern.

In the structure as shown in FIGS. 5A and 5B, one side portion of the induction element 23 is connected via the connection pad 13 to a circuit element (not shown) in the circuit element forming area 12 of the semiconductor substrate 11, and a projection electrode 25 is formed on the upper surface of the other side portion of the induction element 23.

The induction element 23 can be formed to any desired shape on the circuit element forming area 12 in accordance with the location of the projection electrode 25 or the shape of the conductive pattern 24. Specifically, in FIG. 5B, a single induction element 23 is formed for a single connection pad. However, this structure may be modified such that a plurality of induction elements are formed for a single connection pad or for a plurality of connection pads. The projection electrode 25 may be formed on the one side portion of the induction element 23.

FIGS. 6A–6E are sectional views useful in explaining a process for manufacturing the semiconductor device of the fourth embodiment. Concerning the same steps as those in the first embodiment, only a brief description will be given.

Figure 6A:
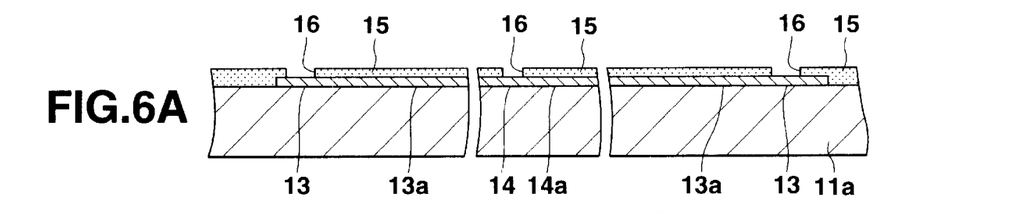
FIGS. 6A–6E are sectional views useful in explaining a process for manufacturing the semiconductor device of the fourth embodiment.

At first, a process as shown in FIG. 6A, which is similar to that shown in FIG. 2A, is executed. Specifically, the first insulating film 15 made of silicon oxide, or silicon nitride, etc. is provided on the upper surfaces of a plurality of connection pads 13 for signal transmission and a pad 14 connected to the ground potential of the circuit element on the circuit surface of a semiconductor wafer substrate 11a. Further, openings 16 are formed in the first insulating film 15, thereby exposing central portions of the connection pads 13 and 14 therethrough.

Figure 6B:
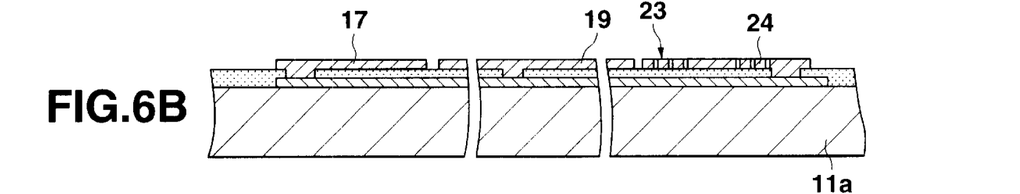

Subsequently, a process as shown in FIG. 6B, which is similar to that shown in FIG. 2B, is executed. Specifically, a conductive pattern 24 is formed on the first insulating film 15 so that it is connected to the connection pads 13 and 14 exposed through the openings 16 that are formed in the first insulating film 15. The conductive layer is patterned into the wiring patterns 17 connected to the connection pads 13 for signal transmission and the conductive layer 19 connected to the connection pad 14, and also into, for example, a square-shaped spiral pattern for creating an inductance component, thereby forming the induction element 23. These metal layers are formed by depositing an UBM layer on the entire surface of the first insulating film 15, then patterning it into a pattern having openings of predetermined shapes, and executing electrolytic plating on the openings. The conductive layers may be made of copper, aluminum, gold or any alloy of these metals, which has excellent conductive properties.

Figure 6C:
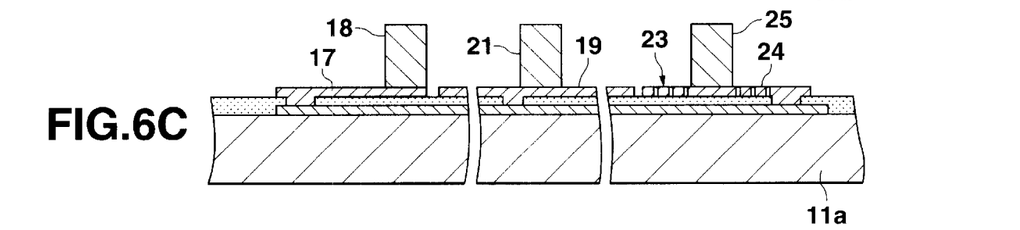

Subsequently, a process as shown in FIG. 6C, which is similar to that shown in FIG. 2C, is executed. Specifically, the projection electrodes 18 are formed on predetermined portions of the wiring patterns 17, the projection electrode 21 is formed on a predetermined portion of the conductive layer 19, and the projection electrode 25 is formed on one terminal of the induction element 23.

Figure 6D:
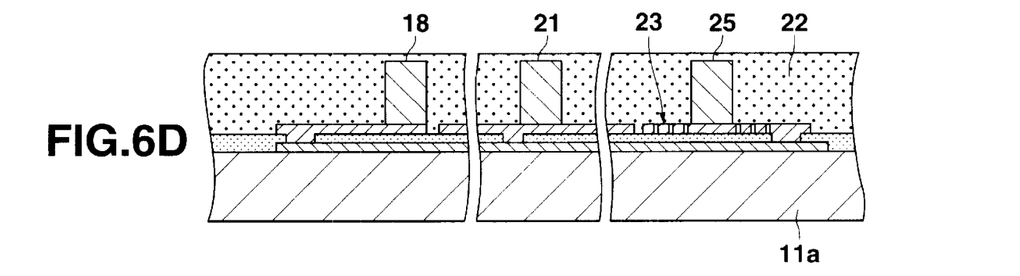

After that, as shown in FIG. 6D, the entire circuit surface of the semiconductor wafer substrate 11a is coated with a resin such as polyimide resin, epoxy resin, etc. so as to cover the projection electrodes 18, 21 and 25, and is hardened, thereby forming the sealing film 22.

Figure 6E:
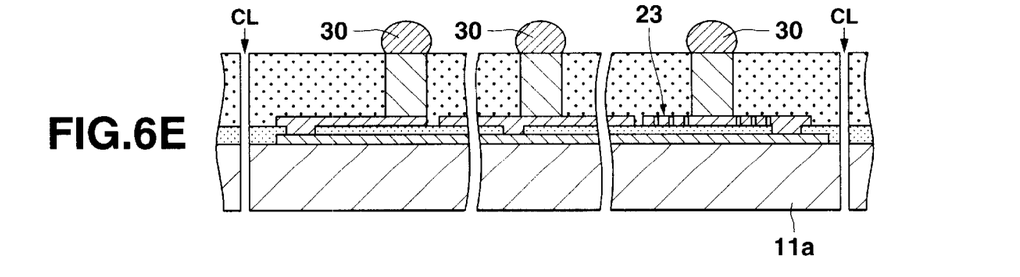

Lastly, as shown in FIG. 6E, the upper surface portion of the sealing film 22 is ground to thereby expose the end surfaces of the projection electrodes 18, 21 and 25 and remove oxide films formed thereon. Where the oxide film is removed, a metalization treatment such as solder printing is executed or the solder balls 30 are formed. After that, the wafer 11a is diced along a predetermined cutting line CL around the chip forming area into chips. Thus, a semiconductor device of a structure as shown in FIG. 5A is created.

Fifth Embodiment

Figure 7A:
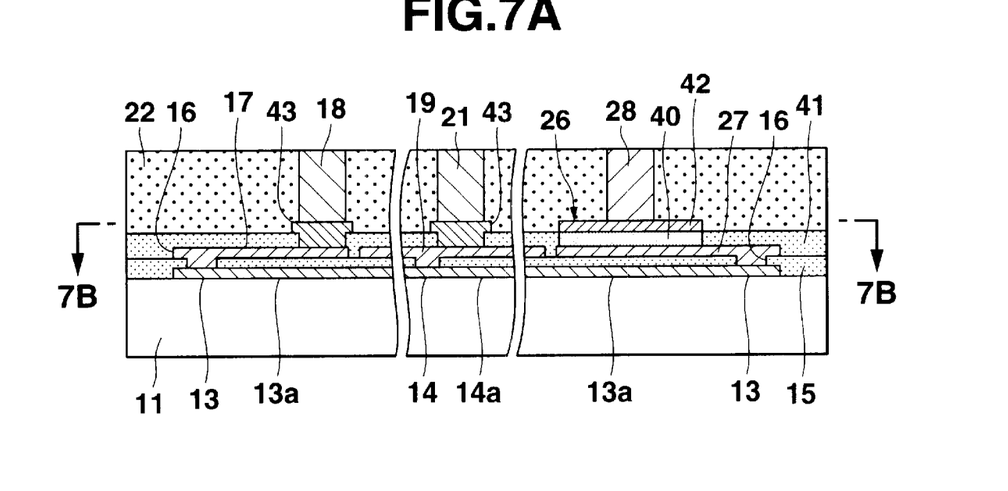
FIG. 7A is a sectional view illustrating the structure of a semiconductor device according to a fifth embodiment of the invention.
Figure 7B:
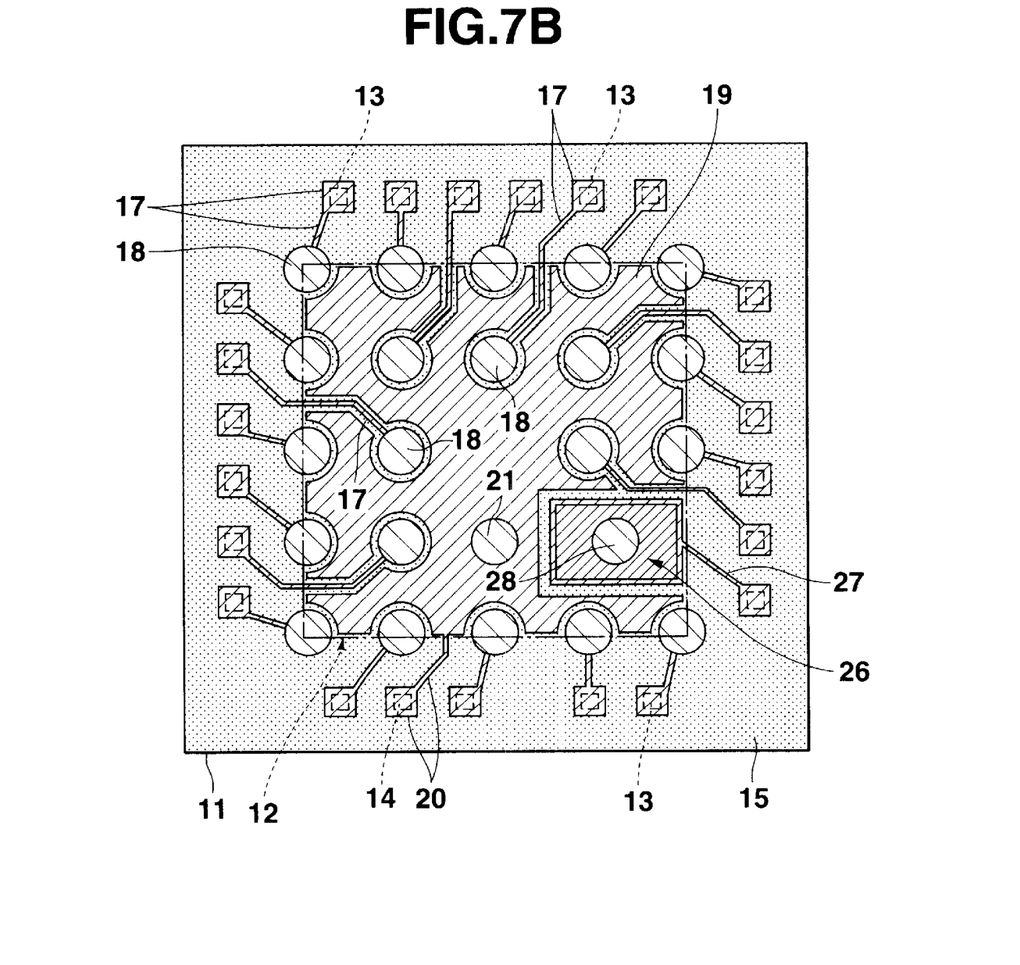
FIG. 7B is a sectional view taken along line 7B—7B of FIG. 7A.

FIG. 7A is a sectional view illustrating an essential part of a semiconductor device according to a fifth embodiment of the invention, and FIG. 7B is a sectional view taken along line 7B—7B of FIG. 7A, showing the semiconductor device of FIG. 7A but not showing a sealing film 22 and insulating film 41 incorporated therein. In these figures, elements similar to those employed in the first embodiment are denoted by corresponding reference numerals, and no detailed description will be given thereof.

The fifth embodiment differs from the first embodiment in that, in the former, wiring patterns 17 and a conductive layer 19, which are formed of a metal layer, are provided on a first insulating film 15, and a capacitor element 26 having a dielectric layer 40 is formed. It is a matter of course that the conductive layer 19 may be extended to the edges of the semiconductor substrate 11 as in the second embodiment.

In the structure shown in FIGS. 7A and 7B, the capacitor element 26 is formed by interposing the dielectric layer 40 between a conductive pattern 27 for a lower electrode and a conductive pattern 42 for an upper electrode. The conductive pattern 27 for the lower electrode is connected to a circuit element (not shown) in the circuit element forming area 12 of the semiconductor substrate 11 via the connection pad 13, while a projection electrode 28 is formed on the conductive pattern 42 for the upper electrode.

The capacitance of the capacitor element 26 constructed as the above is determined from the dielectric constant, the thickness and the area of a dielectric constituting the dielectric layer 40. The dielectric material of the dielectric layer 40 is, for example, barium titanate, or tantalum titanate, etc.

Further, concerning the capacitor element 26, the number of capacitor elements, the location of the capacitor element, etc. may be varied in accordance with the location of the projection electrode 28, and/or the shape or the location of the conductive layer. Specifically, although a single capacitor element 26 is employed in the case of FIG. 7B, a plurality of capacitor elements 26 may be used. Moreover, the projection electrode 28 may be located at the lower electrode side of the capacitor element 26.

FIGS. 8A–8E are sectional views useful in explaining a process for manufacturing the semiconductor device of the fifth embodiment. Concerning the same steps as those in the first embodiment, only a brief description will be given.

Figure 8A:
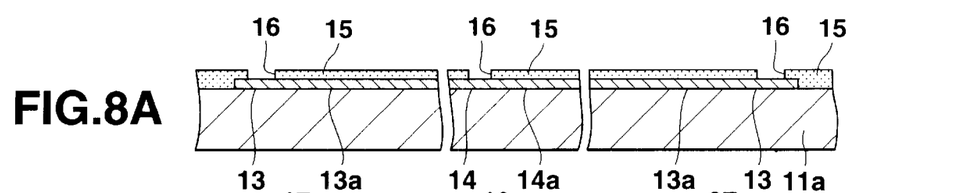
FIGS. 8A–8G are sectional views useful in explaining a process for manufacturing the semiconductor device of the fifth embodiment.

At first, a process as shown in FIG. 8A, which is similar to that shown in FIG. 2A, is executed. Specifically, the first insulating film 15 made of silicon oxide, or silicon nitride, etc. is provided on the upper surfaces of a plurality of connection pads 13 for signal transmission and a pad 14 connected to the ground potential of the circuit element on the circuit surface of a semiconductor wafer substrate 11a. Further, openings 16 are formed in the first insulating film 15, thereby exposing central portions of the connection pads 13 and 14 therethrough.

Figure 8B:
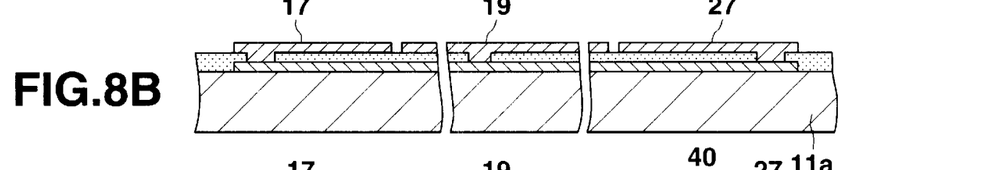

Subsequently, a process as shown in FIG. 8B, which is similar to that shown in FIG. 2B, is executed. Specifically, a first metal layer is formed on the first insulating film 15 so that it is connected to the connection pads 13 and 14 exposed through the openings 16 that are formed in the first insulating film 15. The first metal layer is patterned into the wiring patterns 17 connected to the connection pads 13 for signal transmission and the conductive layer 19 connected to the connection pad 14, and also into, for example, a pattern for the lower electrode of the capacitor element 26, thereby forming the conductive pattern 27 for the lower electrode. These metal layers are formed by depositing an UBM layer on the entire surface of the first insulating film 15, then patterning it into a pattern having openings of predetermined shapes, and executing electrolytic plating on the openings. The metal layers may be made of copper, aluminum, gold or any alloy of these metals, which has excellent conductive properties.

Figures 8C, 8D:
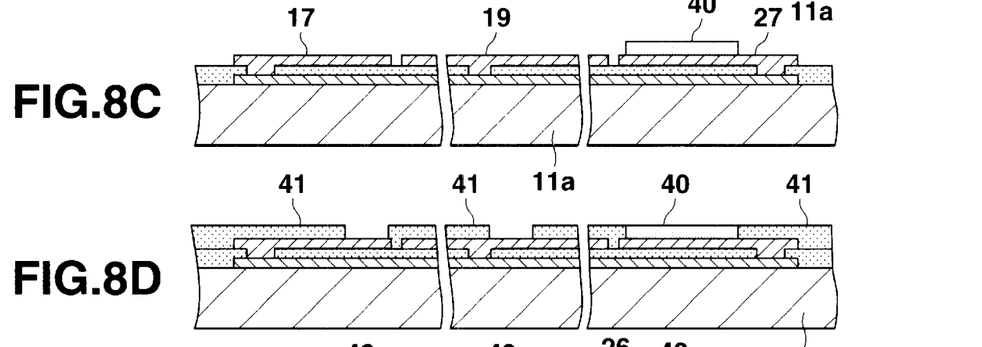

After that, as shown in FIG. 8C, the dielectric layer 40 is formed on a predetermined portion of the conductive pattern 27 for the lower electrode by, for example, executing resist patterning, and then depositing, by sputtering, a dielectric material to a predetermined thickness.

Then, as shown in FIG. 8D, a second insulating film 41 is formed on the entire circuit surface of the semiconductor wafer substrate 11a except for on the dielectric layer 40, and openings are formed in those portions of the second insulating film 41, in which a second metal layer 43 described later is provided. Like the first insulating film 15, the second insulating film 41 is formed by, for example, coating the entire circuit surface of the wafer with a polyimide-based resin, hardening the resin and patterning an insulating film provided thereon.

Figure 8E:
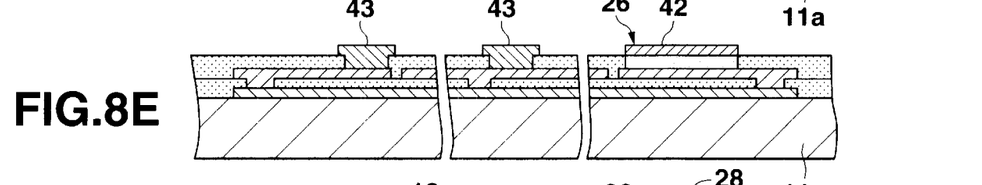

Thereafter, as shown in FIG. 8E, the second metal layer is provided on the wiring patterns 17 and the conductive layer 19 exposed through the openings formed in the second insulating film 41, and also on the dielectric layer 40. The second metal layer is then patterned to a predetermined shape to thereby form first connection layers 43 and to form a conductive pattern 42 for an upper electrode provided on and electrically connected to the dielectric layer 40. One or more of the first layers 43 are electrically connected to the conductive layer 19 and the remaining layers 43 are connected to the wiring patterns 17. The first connection layer 43 and the conductive pattern 42 for the upper electrode are formed by executing resist patterning and then electrolytic plating as in the case of forming the first metal layer.

Figure 8F:
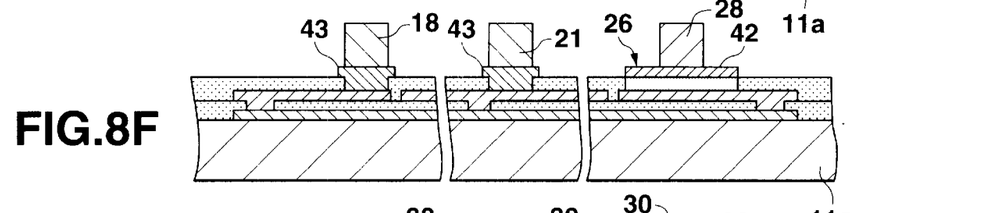

Then, a process as shown in FIG. 8F, which is similar to that shown in FIG. 2C, is executed. Specifically, the projection electrode 18 is provided on the portion of the connection layer 43 connected to the wiring pattern 17, while the projection electrode 21 is provided on the portion of the connection layer 43 connected to layer 19. Further, the projection electrode 28 is provided on the conductive pattern 42 for the upper electrode.

Figure 8G:
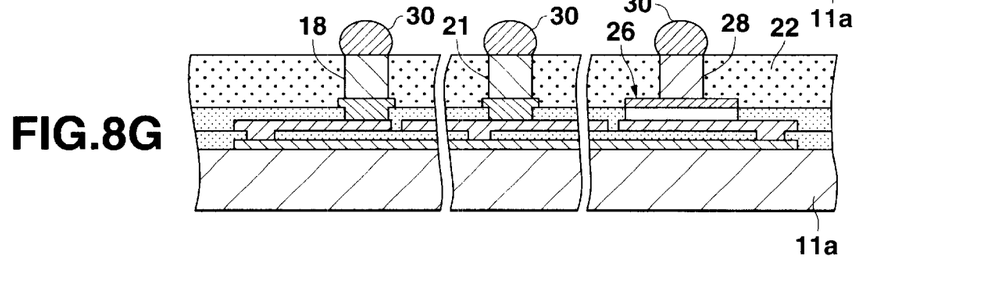

After that, as shown in FIG. 8G, a resin such as polyimide or epoxy is coated on the entire circuit surface of the semiconductor wafer substrate 11a to cover the projection electrodes 18, 21 and 28, and is hardened, thereby forming the sealing film 22. The upper surface of the sealing film 22 is ground to expose the upper surfaces of the projection electrodes 18, 21 and 28 and remove oxide films formed thereon. Where the oxide films are removed, a metalizing treatment such as solder printing is executed or solder balls 30 are formed.

After that, the wafer 11a is diced along predetermined cutting lines CL around the chip forming area into chips as in the case of FIG. 2E, although this process is not shown. As a result, a semiconductor device of a structure as shown in FIG. 7A is created.

Sixth Embodiment

Figure 9A:
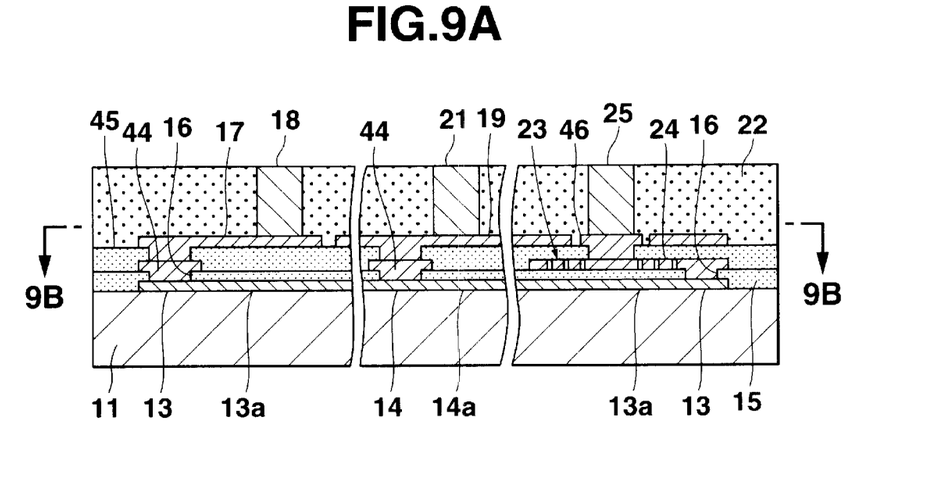
FIG. 9A is a sectional view illustrating the structure of a semiconductor device according to a sixth embodiment of the invention.
Figure 9B:
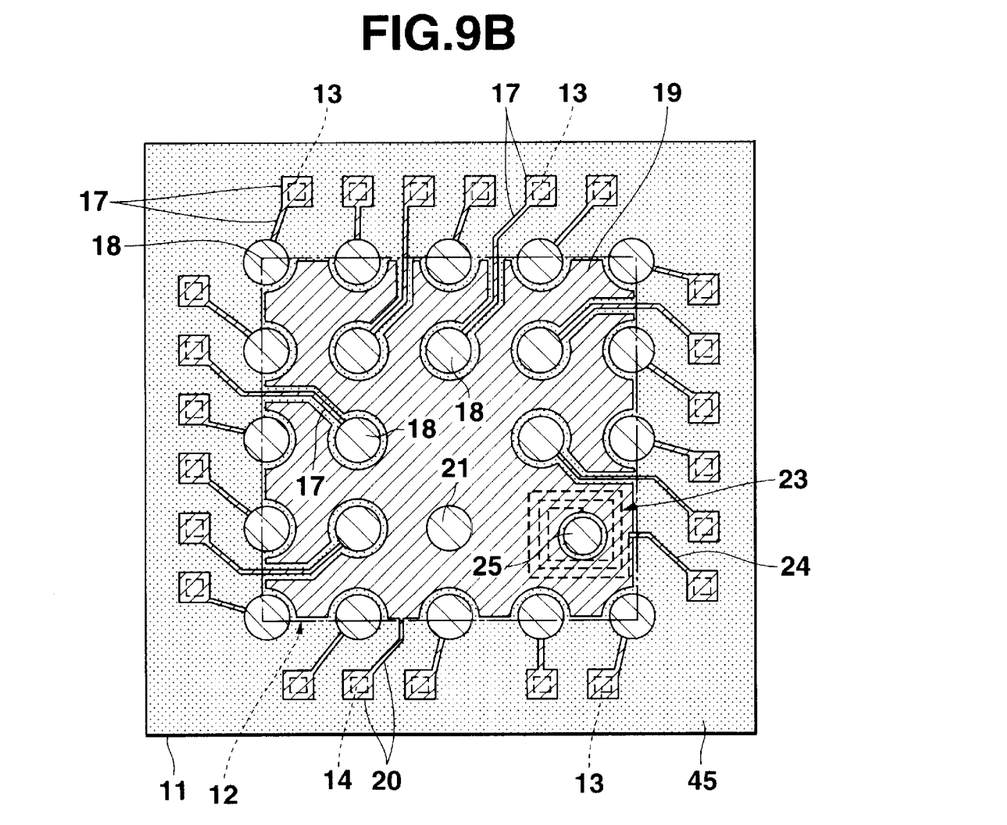
FIG. 9B is a sectional view taken along line 9B—9B of FIG. 9A.

FIG. 9A is a sectional view illustrating an essential part of a semiconductor device according to a sixth embodiment of the invention, and FIG. 9B is a sectional view taken along line 9B—9B of FIG. 9A, showing the semiconductor device of FIG. 9A but not showing a sealing film 22 incorporated therein. In these figures, elements similar to those employed in the first embodiment are denoted by corresponding reference numerals, and no detailed description will be given thereof.

In the fourth embodiment, the induction element 23 and the conductive layer 19 are formed of the same layer, while in the sixth embodiment, the induction element 23 is formed below the conductive layer 19. In FIG. 9B, the induction element 23 is indicated by the broken line. It is a matter or course that the conductive layer 19 may be extended to the edges of the semiconductor substrate 11 as in the second embodiment.

In the structure shown in FIGS. 9A and 9B, the induction element 23 is provided on the first insulating film 15. The conductive layer 19 is provided on the induction element 23, with a third insulating film 45 interposed therebetween. One side portion of the induction element 23 is connected via the connection pad 13 to a circuit element (not shown) in the circuit element forming area 12 of the semiconductor substrate 11, and a projection electrode 25 is formed on the upper surface of the other side portion of the induction element 23 with the third insulating film 45 interposed therebetween. The induction element 23 is formed of the conductive pattern 24 patterned such that an inductance component is created, as in the fourth embodiment.

Further, wiring patterns 17 are respectively connected to connection pads 13 by a second connection layer 44, and provided on the third insulating film 45. The conductive layer 19 is provided on the third insulating film 45 except for on those portions of the film 45, on which the wiring pattern 17 or a third connection layer 46 is provided, and on the portions of the film 45 near the wiring pattern 17. The conductive layer 19 is connected to the connection pad 14 by the second connection layer 44.

The induction element 23 can be formed to any desired shape in accordance with the location of the projection electrode 25 or the shape of the conductive pattern 24. Specifically, in FIG. 9B, a single induction element 23 is formed for a single connection pad. However, this structure may be modified such that a plurality of induction elements are formed for a single connection pad or for a plurality of connection pads. The projection electrode 25 may be formed on the one side portion of the induction element 23, with the third connection layer 46 interposed therebetween.

Since, in the sixth embodiment, substantially the entire circuit element forming area 12 including the induction element of a stacked structure is covered with conductive layer 19, the effect of preventing electromagnetic noise generated in the circuit element forming area 12 or in the induction element from leaking to the outside, or the effect of preventing the influence of electromagnetic noise entering the device from the outside can be more enhanced than in the fourth embodiment, even where, for example, the induction element has such a stacked structure.

FIGS. 10A–10F are sectional views useful in explaining a process for manufacturing the semiconductor device of the sixth embodiment shown in FIG. 9A. Concerning the same steps as those in the fourth embodiment, only a brief description will be given.

Figure 10A:
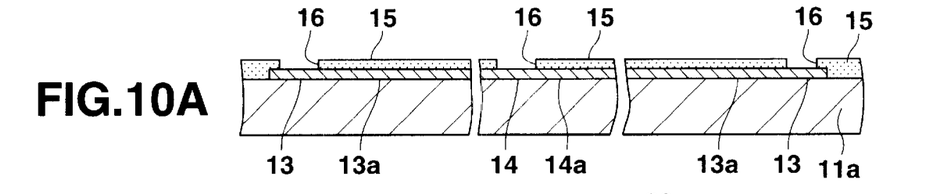
FIGS. 10A–10F are sectional views useful in explaining a process for manufacturing the semiconductor device of the sixth embodiment.

At first, a process as shown in FIG. 10A, which is similar to that shown in FIG. 2A, is executed. Specifically, the first insulating film 15 made of silicon oxide, or silicon nitride, etc. is provided on the upper surfaces of a plurality of connection pads 13 and 14 formed on the circuit surface of a semiconductor wafer substrate 11a. Further, openings 16 are formed in the first insulating film 15, thereby exposing central portions of the connection pads 13 and 14 therethrough.

Figure 10B:
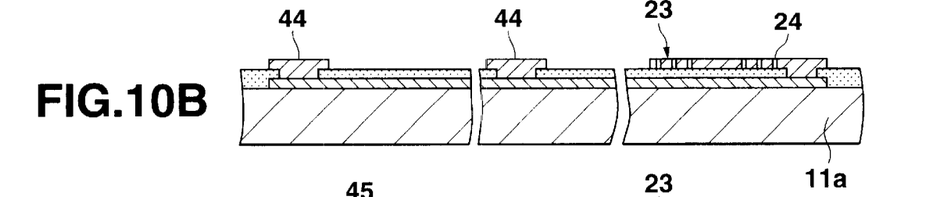

Subsequently, as shown in FIG. 10B, a first layer is formed on the first insulating film 15 so that it is connected to the connection pads 13 and 14 exposed through the openings 16 that are formed in the first insulating film 15. The first layer is patterned into the second connection layer 44 connected to the connection pads 13 for signal transmission and the connection pad 14 connected to the ground potential of the circuit element, and also into a conductive 24 in the form of, for example, a square-shaped spiral pattern, thereby forming the induction element 23 having an inductance component. These layers are formed by depositing an UBM layer on the entire surface of the first insulating film 15, then patterning it into a pattern having openings of predetermined shapes, and executing electrolytic plating on the openings. The conductive layers may be made of copper, aluminum, gold or any alloy of these metals, which has excellent conductive properties.

Figure 10C:
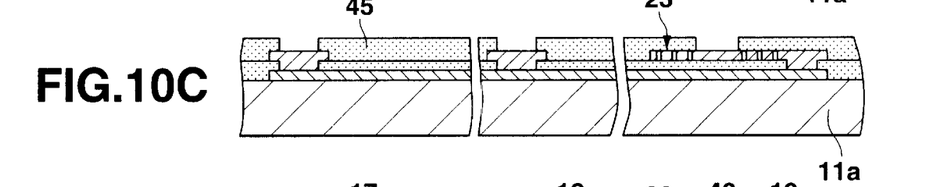

After that, as shown in FIG. 10C, the third insulating film 45 is formed on the entire circuit surface of the semiconductor wafer substrate 11a, and openings are formed in those portions of the film 45, in which the wiring patterns 17, the conductive layer 19 and the third connection layer 46 described later are to be provided.

Figure 10D:
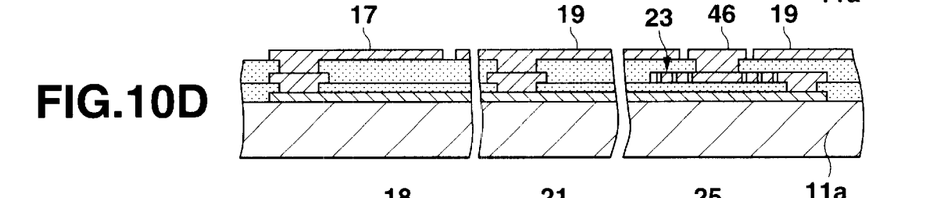

Then, as shown in FIG. 10D, a second metal layer is formed on the second connection layer 44 and the conductive pattern 24 exposed through the openings formed in the third insulating film 45, and is patterned into the wiring patterns 17, the conductive layer 19 and the third connection layer 46.

Figure 10E:
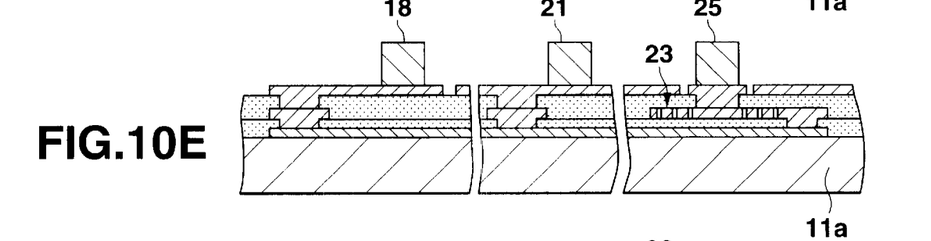

Thereafter, a process as shown in FIG. 10E, which is similar to that shown in FIG. 2C, is executed. Specifically, the projection electrode 18, the projection electrode 21 and the projection electrode 25 are respectively formed on the wiring patterns 17, the conductive layer 19 and that portion of the third connection layer 46 below which the conductive pattern 24 is formed.

Figure 10F:
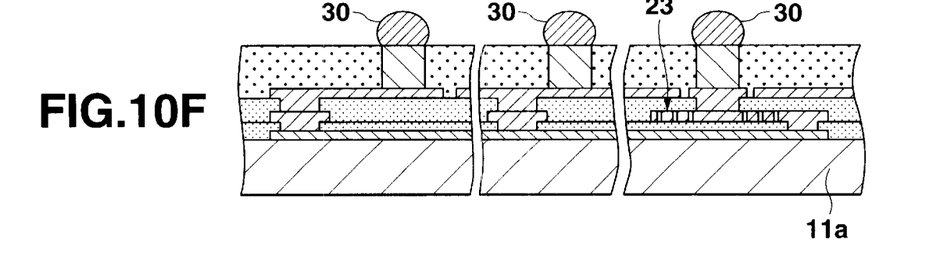

After that, as shown in FIG. 10F, a resin such as polyimide or epoxy is coated on the entire circuit surface of the semiconductor wafer substrate 11a to cover the projection electrodes 18, 21 and 25, and is hardened, thereby forming the sealing film 22. The upper surface of the sealing film 22 is ground to expose the upper surfaces of the projection electrodes 18, 21 and 25 and remove oxide films formed thereon. Where the oxide films are removed, a metalizing treatment such as solder printing is executed or solder balls 30 are formed.

Lastly, the wafer 11a is diced along a predetermined cutting line CL around the chip forming area into chips as in the case of FIG. 2E, although this process is not shown. As a result, a semiconductor device of a structure as shown in FIG. 9A is created.

By virtue of the conductive layer 19, the fourth, fifth and sixth embodiments can provide the same advantage as that of the first, second and third embodiments, i.e. the effect of suppressing the leakage of electromagnetic noise from the circuit element forming area 12, and suppressing the influence of external electromagnetic noise. Moreover, since, in the fourth, fifth and sixth embodiments, one or more thin film circuit elements such as induction elements, capacitor elements, etc. can be stacked on the circuit element forming area 12, multiple functions can be imparted to the semiconductor device, without changing the size of the semiconductor substrate 11. In addition, since, in the fourth, fifth and sixth embodiments, those circuit elements, which are formed in the circuit element forming area 12 in the prior art, are stacked on the area 12, the semiconductor substrate 11 can be made more compact than in the prior art.

Although in the fourth, fifth and sixth embodiments, the thin film circuit elements stacked on the circuit element forming area are the induction elements or the capacitor elements, other thin film circuit elements such as a microstrip line, an MMIC (Microwave Monolithic Integrated Circuit), etc. may be provided in place of the aforementioned elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a circuit element forming area and a plurality of connection pads;
   an insulating film formed on the circuit element forming area;
   a plurality of wiring patterns which are formed on the insulating film, and which are each respectively connected to a corresponding one of the plurality of connection pads;
   a plurality of projection electrodes which are each formed in a columnar shape on a corresponding one of the plurality of wiring patterns, and which each have an exposed end face;
   a ground layer formed on substantially an entire upper surface of the insulating film except for areas at which the plurality of wiring patterns are formed; and
   a ground projection electrode which is formed in a columnar shape on said ground layer, and which has an exposed end face.

2. The semiconductor device according to claim 1, wherein said plurality of connection pads include at least one connection pad connected to a ground potential and connected to said ground layer.

3. The semiconductor device according to claim 1, wherein said ground layer and said wiring patterns are made of a same material and are formed simultaneously.

4. The semiconductor device according to claim 1, wherein said ground layer extends to edges of the semiconductor substrate.

5. The semiconductor device according to claim 1, wherein:
   a sealing film is provided on substantially an entire upper surface of the semiconductor substrate except for areas at which said projection electrodes and said ground projection electrode are formed; and
   the exposed end faces of the projection electrodes and the ground projection electrode are uncovered by the sealing film.

6. The semiconductor device according to claim 1, further comprising at least one thin film circuit element provided between the semiconductor substrate and said ground layer.

7. The semiconductor device according to claim 6, wherein said thin film circuit element includes one of a thin film capacitor, a thin film inductor, a micro-strip line and a microwave monolithic integrated circuit.

8. The semiconductor device according to claim 1, further comprising at least one thin film circuit element which is provided on said semiconductor substrate and which includes a conductive pattern, wherein said conductive pattern and said ground layer are formed in at least one same layer.

9. The semiconductor device according to claim 8, wherein said thin film circuit element includes one of a thin film capacitor, a thin film inductor, a micro-strip line and a microwave monolithic integrated circuit.

10. A semiconductor device comprising:
    a semiconductor substrate having a circuit element forming area and a plurality of connection pads;
    an insulating film formed on the circuit element forming area;
    a plurality of wiring patterns which are formed on the insulating film, and which are each respectively connected to a corresponding one of the plurality of connection pads;
    a plurality of projection electrodes which are each formed in a columnar shape on a corresponding one of the plurality of wiring patterns, and which each have an exposed end face; and
    a ground layer formed on substantially an entire upper surface of the insulating film except for areas at which the plurality of wiring patterns are formed;
    wherein said ground layer is divided into a plurality of sections;
    wherein said plurality of connection pads include at least one connection pad connected to a ground potential;
    wherein one of said divided ground layer sections is connected to said connection pad connected to the ground potential; and
    wherein a ground projection electrode is provided on each of said divided ground layer sections, and each ground projection electrode is formed in a columnar shape and has an exposed end face.

* * * * *